United States Patent
Hasegawa et al.

(10) Patent No.: US 9,541,577 B2
(45) Date of Patent: Jan. 10, 2017

(54) CURRENT APPLICATION DEVICE AND MANUFACTURING METHOD OF SEMICONDUCTOR ELEMENT

(71) Applicant: HONDA MOTOR CO., LTD., Tokyo (JP)

(72) Inventors: Satoshi Hasegawa, Tochigi (JP); Shigeto Akahori, Tochigi (JP); Shinya Maita, Wako (JP); Hitoshi Saito, Tochigi (JP); Yoko Yamaji, Tochigi (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 14/147,868

(22) Filed: Jan. 6, 2014

(65) Prior Publication Data
US 2014/0193928 A1    Jul. 10, 2014

(30) Foreign Application Priority Data

Jan. 8, 2013 (JP) .................................. 2013-001192
Nov. 15, 2013 (JP) .................................. 2013-236886

(51) Int. Cl.
*G01R 1/067* (2006.01)
*G01R 31/26* (2014.01)

(52) U.S. Cl.
CPC ....... *G01R 1/06777* (2013.01); *G01R 31/2621* (2013.01); *G01R 31/2637* (2013.01)

(58) Field of Classification Search
None
See application file for complete search history.

(56) References Cited

U.S. PATENT DOCUMENTS

| | | | |
|---|---|---|---|
| 5,629,630 A * | 5/1997 | Thompson et al. | 324/754.13 |
| 6,888,360 B1 * | 5/2005 | Connell et al. | 324/756.07 |
| 7,365,558 B2 * | 4/2008 | Bjork | 324/750.05 |
| 7,446,398 B2 * | 11/2008 | Niu | H01L 23/49816 |
| | | | 257/668 |
| 7,538,567 B2 * | 5/2009 | Lu et al. | 324/754.07 |

FOREIGN PATENT DOCUMENTS

| | | |
|---|---|---|
| JP | 2007-171139 | 7/2007 |
| JP | 2007-218675 | 8/2007 |
| JP | 2009-128190 | 6/2009 |
| JP | 2009-200272 | 9/2009 |

OTHER PUBLICATIONS

Japanese Office Action dated Apr. 7, 2015, 4 pages, 2013-236886.

* cited by examiner

*Primary Examiner* — Paresh Patel
(74) *Attorney, Agent, or Firm* — Rankin, Hill & Clark LLP

(57) ABSTRACT

Provided is a current application device capable of applying a test current of a magnitude necessary for testing of a semiconductor element without any trouble. A current application device 1 is configured to have a contacting section having a plurality of projections 21 for contacting a contact region 24 inside an active region 23 of a semiconductor element 22 and applying the test current thereto, and a pressing section 3 which presses the contacting section 2 against the semiconductor element 22 such that each projection 21 contacts the contact region 24. A plurality of the projections 21 are arranged such that an arrangement density of outside projections 21 is larger than the arrangement density of inside projections 21.

7 Claims, 8 Drawing Sheets

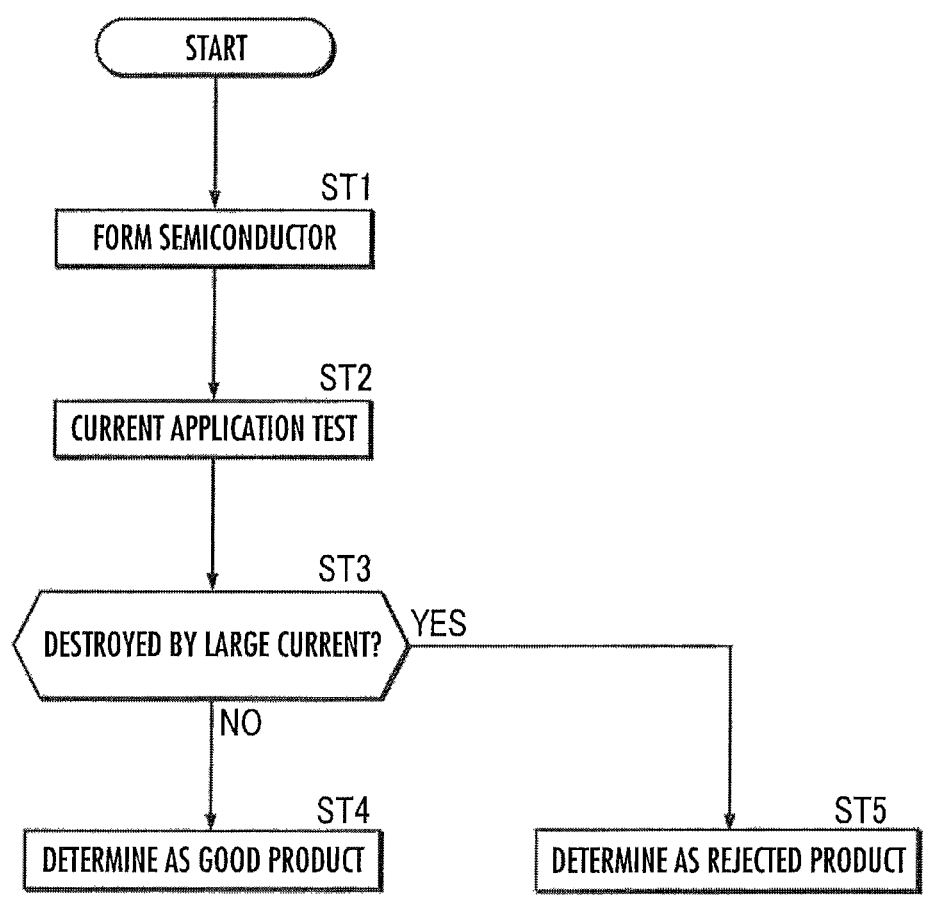

CURRENT APPLICATION DEVICE AND MANUFACTURING METHOD OF SEMICONDUCTOR ELEMENT

BACKGROUND OF THE INVENTION

Field of the Invention

The present invention relates to a current application device which applies a test current to a semiconductor element, and a method for manufacturing the semiconductor element using the same.

Description of the Related Art

Generally, a semiconductor element testing device used in testing the semiconductor element is configured to have a current application device which applies a test current for testing electrical characteristics of the semiconductor element to the semiconductor element. Conventionally, as such current application device, the one in which the test current is applied via a contacting section (a probe) having a projection group comprising a plurality of projections that are arranged at a constant interval (for example, refer to Japanese patent Application Laid-Open No. 2007-218675).

In such current application device, the test current is applied while pressing the contacting section against the semiconductor element with a spring, such that each projection constituting the projection group contacts an electrode and the like of the semiconductor element. At this time, a reaction force that the contacting section receives from the semiconductor element from the contact is dispersed to each projection, so that it becomes possible to delay a progress in abrasion of a gold metal layer and the like at a leading end of the projection.

By doing so, it becomes possible to maintain a stable electrical contact between the semiconductor element and the contacting section during application of the test current for a long period of time. Further, by doing so, it is conceivable that application of large test current is possible, from the contact portion contacting well with an electrode and the like of the semiconductor element with each projection, and also from the test current being dispersed and applied via each projection.

In a screening test for power semiconductor elements such as an IGBT (Insulated Gate Bipolar Transistor) or power MOSFET and the like, large current is applied to a contact region within an active region of the semiconductor element. In this case, it is conceivable that it is preferable to use the contacting section having the projection group as is explained above, and distribute and apply the test current uniformly with each projection, so as to be capable of applying the large current uniformly throughout the whole contact region as much as possible.

In this case, number of projections necessary may be determined, on the basis of a magnitude of necessary test current, and a critical current value that can be applied from one projection. Further, it becomes possible to set an arrangement pitch of the projections at the contacting section so as to correspond to an area of the contact region in the active region, according to the number of projections.

However, in a case where such contacting section is used, it has been discovered that there is an inconvenience that a current value flowing in a part of the projections reaches the critical current value by only supplying a current smaller than the test current with necessary magnitude to the contacting section, so that the test current with the necessary magnitude cannot be applied.

SUMMARY OF THE INVENTION

In view of such problem of the conventional technique, an object of the present invention is to provide a current application device capable of applying a test current with necessary magnitude for testing of a semiconductor element without any trouble, and a method for manufacturing the semiconductor element which is tested appropriately using the current application device.

A current application device of the present invention is a device for applying test current to a semiconductor element, comprising: a contacting section which includes a plurality of projections for contacting a contact region within an active region of the semiconductor element and for applying a test current thereto and a pressing section which presses the contacting section against the semiconductor element such that a plurality of the projections contact the contact region, in which the plurality of projections are arranged such that an arrangement density of outside projections among a plurality of the projections becomes larger than an arrangement density of inside projections. In the present invention, the arrangement density of the projection is an index represented by a number or an area ratio of projections arranged in a predetermined region, and for example is defined by an arrangement interval or an arrangement area of the projections.

According to the current application device of the present invention, when applying the test current to the semiconductor element, the contacting section is pressed against the semiconductor element such that the projections of the contacting section contacts the contact region in the active region of the semiconductor element. At this state, the test current is supplied to the contacting section, and is applied to the active region of the semiconductor element through each projection.

At this time, no other projections exist outside the projections positioned at outside among the plurality of the projections, and only a surrounding section of the active region exists. As such, if the arrangement density of each projection in the contacting section is uniform throughout the contacting section, the current flowing into the active region from the projections positioned at the outside flows not only into a range of the active region close to the outside projections but also to a side on the surrounding section of the active region outside the range.

On the other hand, the range of the active region to which the current flows from the inside projections among the plurality of the projections becomes limited than that of the outside projections, in relation with the other projections existing in neighborhood. Therefore, more current flows into the active region from the outside projections than the inside projections. As such, the outside projections reach the critical current value with a smaller supply current to the contacting section than the inside projections.

Therefore, compared to a case where equal current flows into the active region from all projections, the current capable of being supplied to the contacting section becomes small. Therefore, in a case where the number of the projections of the contacting section and the like are designed so as to be capable of applying the test current of the necessary magnitude, which is obtained on assumption that equal current flows to all the projections, there is a fear that the test current of the necessary magnitude cannot be applied unintendedly.

In the present invention, however, the arrangement density of the outside projections is larger than the arrangement density of the inside projections. Therefore, by appropriately determining the arrangement density of the projections, it becomes possible to equalize the magnitude of the current flowing into the active region for each projection, and to maximize the current capable of being applied from a certain number of projections to the contacting section. By doing so, it becomes possible to easily set the number of projections for obtaining the test current of the necessary magnitude, and to apply the test current with the intended magnitude without any trouble.

In the present invention, in a case where the arrangement density is defined by an arrangement interval of the plurality of the projections, preferably an arrangement interval of the outside projections among the plurality of projections is smaller than the arrangement interval of the inside projections.

Further, preferably, the plurality of the projections are arranged in a rectangular region, and an arrangement interval of the projections at an outer peripheral portion is smaller than the arrangement interval at the projections inside the region, and also the arrangement interval of the projections at a corner portion of the region among the projections at the outer peripheral portion is smaller. By doing so, it becomes possible to equalize the magnitude of the current flowing into the active region from each projection of the contacting section more effectively throughout the contacting section.

In the present invention, preferably the arrangement interval of the plurality of the projections is set to be smaller for each projection corresponding to a portion in which a current density of the active region becomes higher in a case where the test current is applied to the contact region from a contacting section in which the arrangement interval of each projection is uniform throughout the contacting section, than the arrangement interval of each projection corresponding to a portion in which the current density becomes lower in the case.

According thereto, it becomes possible to set the arrangement intervals of the projections, taking into consideration the distribution of the current density in the active region in a case where the test current is applied using the contacting section having projections with uniform arrangement interval explained above. By doing so, it becomes possible to equalize the magnitude of the current flowing into the active region from each projection of the contacting section more effectively throughout the contacting section.

In the present invention, in a case where the arrangement density is defined by an arrangement area of the plurality of the projections, preferably an arrangement area of the outside projections among the plurality of projections is larger than the arrangement area of the inside projections.

Further, preferably, the plurality of the projections are arranged in a rectangular region, and an arrangement area of the projections at an outer peripheral portion of the region is larger than the arrangement area of the projections inside the region, and also the arrangement area of the projections at a corner portion of the region among the projections at the outer peripheral portion of the region is larger than the arrangement area of other projections at the outer peripheral portion. By doing so, it becomes possible to equalize the magnitude of the current flowing into the active region from each projection of the contacting section more efficiently throughout the contacting section.

In the present invention, preferably, an arrangement area of the plurality of the projections is set to be larger for each projection corresponding to a portion in which a current density of the active region becomes higher in a case where the test current is applied to the contact region from a contacting section in which the arrangement area of each projection is uniform throughout the contacting section, than the arrangement area of each projection corresponding to a portion in which the current density becomes lower in the case. By doing so, it becomes possible to equalize the magnitude of the current flowing into the active region from each projection of the contacting section more efficiently throughout the contacting section.

A manufacturing method of a semiconductor of the present invention includes a forming step in which the semiconductor element is formed; a current application step in which a test current is applied to the semiconductor element formed in the forming step, using a current application device of the present invention, and a determination step of determining whether or not the semiconductor element applied with the test current in the current application step satisfies a predetermined performance, based on the test current.

According thereto, it becomes possible to manufacture the semiconductor element that is appropriately tested using the current application device capable of applying the test current of the magnitude necessary for the testing of the semiconductor element without any trouble.

BRIEF DESCRIPTION OF THE DRAWINGS

FIG. 9 is a flow chart showing steps of a method of manufacturing the semiconductor element which is appropriately tested using the current application device of FIG. 1.

DESCRIPTION OF THE PREFERRED EMBODIMENTS

An embodiment of the present invention will be explained below with reference to the accompanying drawings. A current application device of the embodiment is used for applying a test current for testing a semiconductor element, by being supplied with a current from an external power source, which is especially suitable for testing of a power semiconductor element used for switching of a large current of approximately 400 to 2000 [A]. As the semiconductor element, an IGBT (insulated gate bipolar transistor), and a power MOSFET fall under the category, for example.

Figure 1:
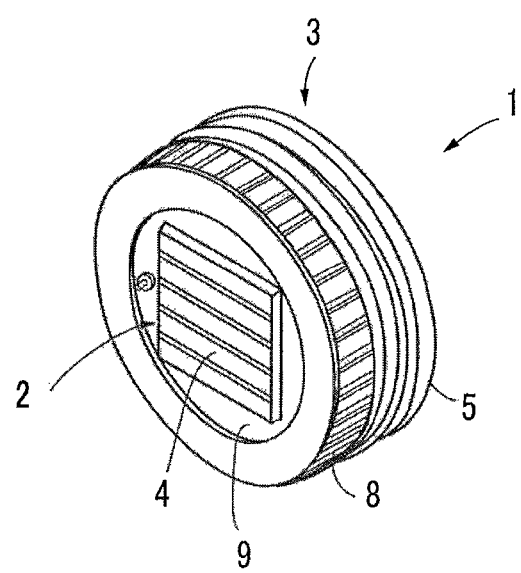
FIG. 1 is a perspective view of a current application device of one embodiment of the present invention.
Figure 2:
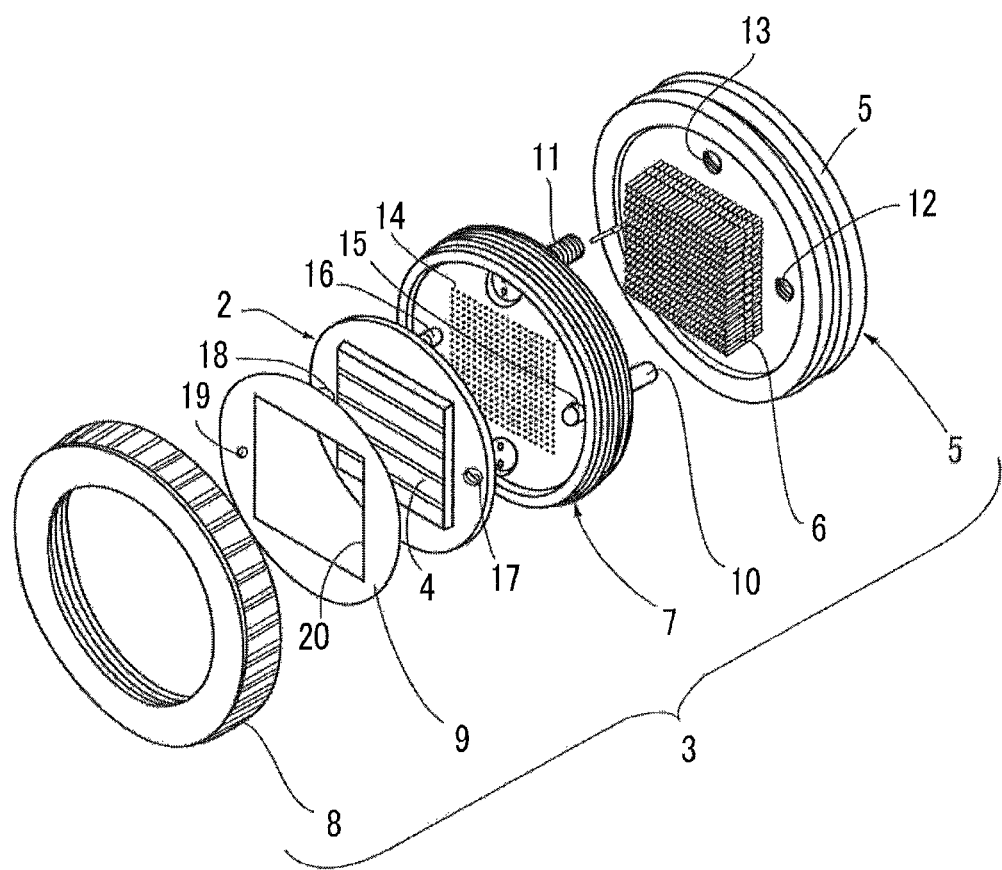
FIG. 2 is an exploded perspective view of the current application device of FIG. 1.

As is shown in FIG. 1 and FIG. 2, a current application device 1 is configured to have a disk-shaped contacting section 2 to which the test current to be applied to the semiconductor element to be tested is supplied, by connecting with an external power source (not shown), and a pressing section 3 which holds the contacting section 2 and presses the same against the semiconductor element.

The contacting section 2 has a contact surface 4 provided with protrusion group, which will be explained later, at a side on which the semiconductor element to be tested is arranged (hereinafter simply referred to as "element side"). The pressing section 3 has a substantially cylindrical shape, and holds the contacting section 2 at an inner side thereof. The pressing section 3 presses the contacting section 2 against the semiconductor element, while holding the contacting section 2 such that the contact surface 4 is retained to be approximately perpendicular to a direction of an axis line of the cylindrical shape (hereinafter simply referred to as "axis line direction"), along the axis line direction.

As is shown in FIG. 2, the pressing section 3 is configured to have a disk-shaped base section 5, a plurality of pins with springs 6 arranged on a surface of the base section 5 on the element side and with a predetermined intervals in horizontal and vertical directions, a disk-shaped guiding-supporting section 7 for supporting the pins with springs 6 in a direction perpendicular to the axis line direction and for guiding the same along the axis line direction, a ring-shaped attaching section 8 for attaching the contacting section 2 to the element side of the guiding-supporting section 7, an insulating plate 9 for insulating the contacting section 2 and the attaching section 8, and a cylinder pin 10 which guides the contacting section 2 in the axis line direction.

The guiding-supporting section 7 is fixed in parallel with respect to the base section 5 by a fixing screw 11. A positioning hole 12 for positioning by inserting an end portion on the opposite side from the element side of the cylinder pin 10, and a screw hole 13 for screwing the fixing screw 11, are provided to the base section 5.

A guiding hole group 14 constituted from a same number of piercing holes as the pins with springs 6 for supporting each pin with spring 6 in the direction perpendicular to the axis line direction and for guiding the same in the axis line direction, a guiding hole 15 as a piercing hole for supporting the cylinder pin 10 in the direction perpendicular to the axis line direction and for guiding the same in the axis line direction, and a cylinder-shaped projecting section 16 erected on the surface on the element side, are provided to the guiding-supporting section 7.

A male screw for fixing the attaching section 8 to the guiding-supporting section 7 is provided to an outer periphery of the guiding-supporting section 7. The arrangement of the guiding hole group 14 constitutes a rectangular pattern corresponding to the contact surface 4 of the contacting section 2, on the surface of the guiding-supporting section 7 on the element side. That is, the surface of the contacting section 2 on the opposite side from the contact surface 4 is supported by each pin with spring 6 guided by the guiding hole group 14, at a region exactly corresponding to the contact surface 4.

The guiding hole 15 and the projecting section 16 are positioned at outside of opposing two sides of the rectangular pattern. To the contacting section 2, a piercing hole 17 and a piercing hole 18 are provided at positions corresponding to the guiding hole 15 and the projecting section 16. The portion constituting the contact surface 4 of the contacting section 2 projects towards the element side with steps, and constitutes a square shape with a rectangular platform section.

An opening hole 19 to which the projecting section 16 of the guiding-supporting section 7 is inserted, and an opening section 20 to which the platform section constituting the contact surface 4 is inserted, are provided to the insulating plate 9. The insulating plate 9 has an outside diameter which fits into an inner wall of the attaching section 8. A female screw corresponding to the male screw of the guiding-supporting section 7 is provided to the inner wall of the attaching section 8. An end surface of the attaching section 8 on the element side is opened with a slightly smaller inner diameter than the outer diameter of the insulating plate 9.

Figure 3:
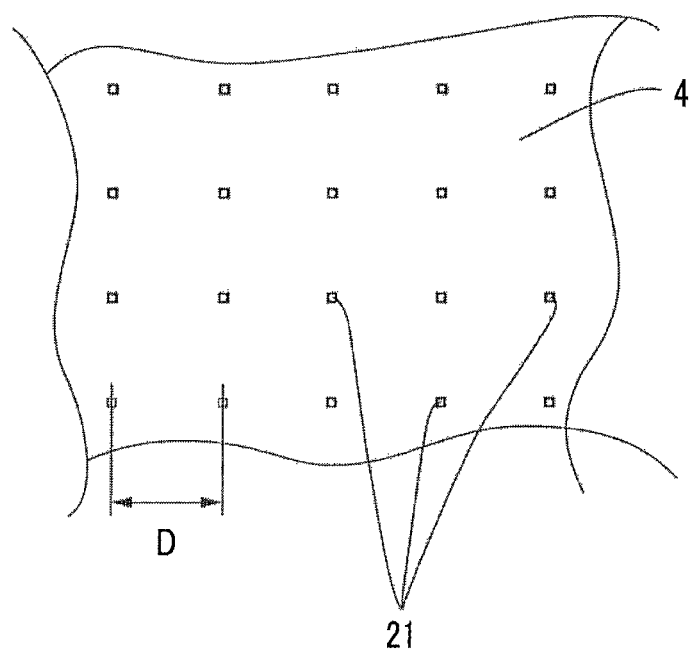
FIG. 3 is an enlarged view of one part of a contacting section in the current application device in FIG. 1.

FIG. 3 shows a part of the contact surface 4 of the contacting section 2. As is shown in FIG. 3, a projection group constituted from a plurality of projections 21 is provided to the contact surface 4. The projections 21 are arranged in a matrix manner with intervals, so that a predetermined pitch D on the contact surface 4 is, for example, approximately 0.5 [mm].

However, the arrangement interval of the projections 21 positioned at an outer periphery of the contact surface 4 or the projection group is smaller than the arrangement interval of the projections 21 positioned inside thereof. The test current supplied to the contacting section 2 flows into an active region of the semiconductor element to be tested, via each projection 21.

Figure 4:
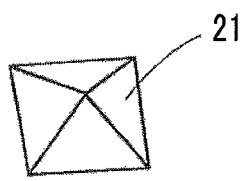
FIG. 4 is a perspective view of projections provided in the contacting section of FIG. 3.

FIG. 4 is a perspective view showing a shape of one projection 21. As is shown in FIG. 4, the projection 21 has a square pyramid-like shape. When the projection group on the contact surface 4 is pressed so as to contact the active region in the semiconductor element to be tested, leading ends of the projections 21 pierce an oxide film of the contacted portion and conduct well with the active region in that portion. The shape of the projection 21 is not limited to the square pyramid-like shape, as long as it is a shape capable of securing favorable conduction as explained above.

The current application device 1 may be assembled as will be explained below. That is, first, the pins with springs 6 are loaded to the guiding hole group 14 of the guiding-supporting section 7, and the guiding-supporting section 7 is attached to the base section 5 with two fixing screws 11. Next, the cylinder pin 10 is inserted to the guiding hole 15 of the guiding-supporting section 7, and further the end portion of the cylinder pin 10 is inserted to the positioning pin 12 of the base section 5.

Next, the contacting section 2 is arranged to the element side of the guiding-supporting section 7, such that the cylinder pin 10 and the projecting section 16 of the guiding-supporting section 7 are respectively inserted to the piercing holes 17 and 18. Next, the insulating plate 9 is arranged to the element side of the contacting section 2, such that the platform section constituting the contact surface 4 of the contacting section 2 is inserted to the opening section 20, and also the projecting section 16 of the guiding-supporting section 7 projecting from the piercing hole 18 of the contacting section 2 is inserted to the opening hole 19.

Thereafter, by fastening the female screw of the attaching section 8 with the male screw of the guiding-supporting section 7, the attaching section 8 is fixed to the guiding-supporting section 7. By doing so, the assembly of the current application device 1 is completed, and the contacting section 2 and the pressing section 3 becomes the state shown in FIG. 1.

At this state, the region corresponding to the contact surface 4 at the surface of the contacting section 2 on the opposite side from the contact surface 4 is supported on the base section 5 while being biased in the element side by a plurality of the pins with springs 6. Further, the contacting section 2 is positioned in the direction perpendicular to the axis line direction by the cylinder pin 10 and the projecting section 16, and also guided so as to be slightly movable in the axis line direction.

Therefore, when pressed against the active region of the semiconductor element to be tested, and in a case where there is a difference in the inclination of the active region and the inclination of the contact surface 4, the contacting section 2 may tilt slightly so as to dissolve the difference.

Figure 5:
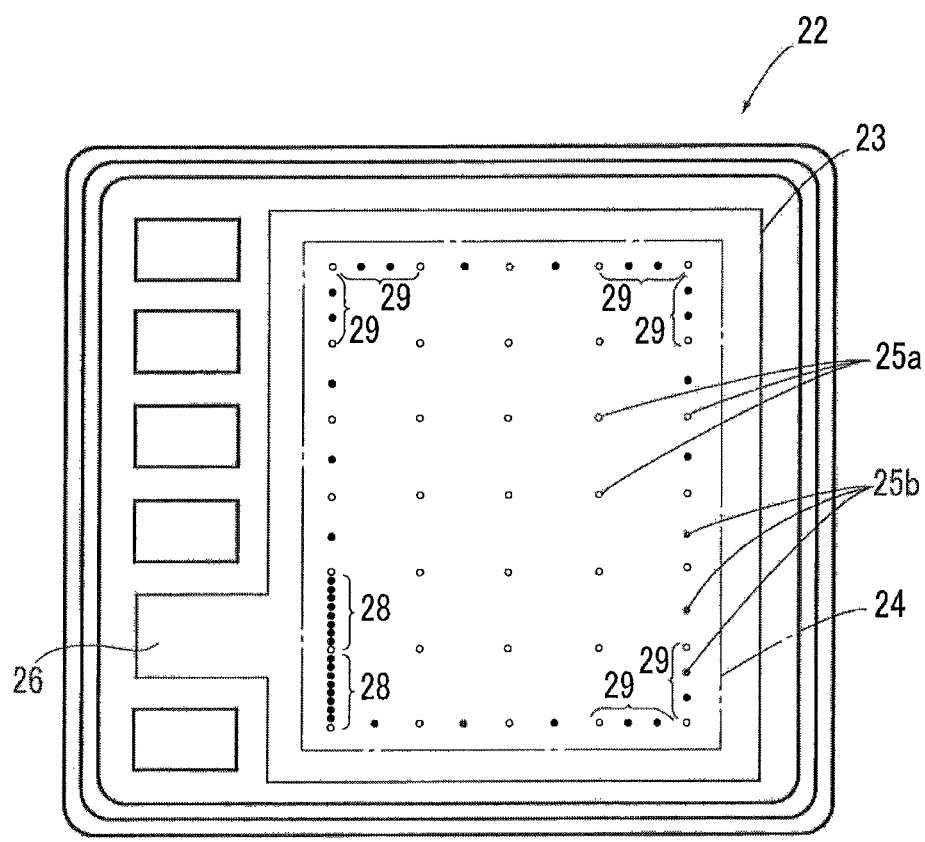
FIG. 5 is a plain view of a semiconductor element to which a test current is applied from the current application device of FIG. 1.

FIG. 5 is a plan view of the semiconductor element which is applied with the test current by the current application device 1. As is shown in FIG. 5, a semiconductor element 22 includes an active region 23 on which a plurality of cells are arranged. A contact region 24 is set inside the active region 23. The contact region 24 is a portion to which the test current is applied by the current application device 1, during test of the semiconductor element 22.

During application of the test current, each projection 21 on the contact surface 4 of the current application device 1 respectively contacts at a plurality of contact points 25 (25a and 25b) inside the contact region 24, and the current flows into the vicinity of the corresponding contact points 25 from each projection 21. As can be seen from the arrangement state of the contact points 25 in FIG. 5, the arrangement interval of the projections 21 in the projection group on the contact surface 4 is smaller in the outside than the inside of the projection group. Therefore, an arrangement density of the outside projections 21 among a plurality of the projections 21 is larger than the arrangement density of the inner projections 21.

Specifically, the projection group is configured from standard projections 21 arranged in a reticular pattern in longitudinal and horizontal directions in a standard interval of 1.2 [mm], for example, and additional projections 21 arranged between each of the outer circumferential standard projections 21 that are positioned at the outermost side of the projection group. In FIG. 5, standard contact point 25a which are the contact points 25 corresponding to the standard projections 21 are denoted by "○" and additional contact points 25b that are contact points 25 corresponding to the additional projections 21 are denoted by "●".

For example, eight additional contact points 25b exist in a space 28 between adjacent standard contact points 25a in a vicinity of a small pad 26 which is an overhanging portion in the active region 23. Further, two additional contact points 25b exist in a space 29 between adjacent reference contact points 25a in three corner portions of the contact region 24 that are spaced apart from the small pad 26. Still further, one additional contact point 25b exists in a space between other standard contact points 25a in the outer peripheral portion of the contact region 24.

In this case, the arrangement interval of the projections 21 in the projection group of the contact surface 4 is smaller in the projections 21 at the outer peripheral portion than the projections 21 at the inner side of the projection group, and also is smaller in the projections 21 at the corner portion among the projections 21 at the outer peripheral portion.

During application of the test current to the semiconductor element 22, the current application device 1 is positioned so as to be located at a predetermined position with respect to the semiconductor element 22, by the semiconductor test device to which the current application device 1 is mounted. At this position, the pressing section 3 presses the contacting section 2 against the semiconductor element 22 by the arrangement of the pins with springs 6, so that the projection group on the contact surface 4 contacts the contact region 24 of the active region 23.

At this time, since the contacting section 2 is guided so as to be capable of tilting slightly by the cylinder pin 10 and the projecting section 16, some tilt of the contact surface 4 with respect to the contact region 24 may be absorbed by the difference in a contracting amount of each pin with spring 6. By doing so, each projection 21 of the contact surface 4 contacts at an approximately equivalent pressing force with respect to the contact region 24. In this state, when the test current is supplied to the contacting section 2, the test current is applied to the contact region 24 at the active region 23 of the semiconductor element 22, via each projection 21 of the contact surface 4.

Figure 6:
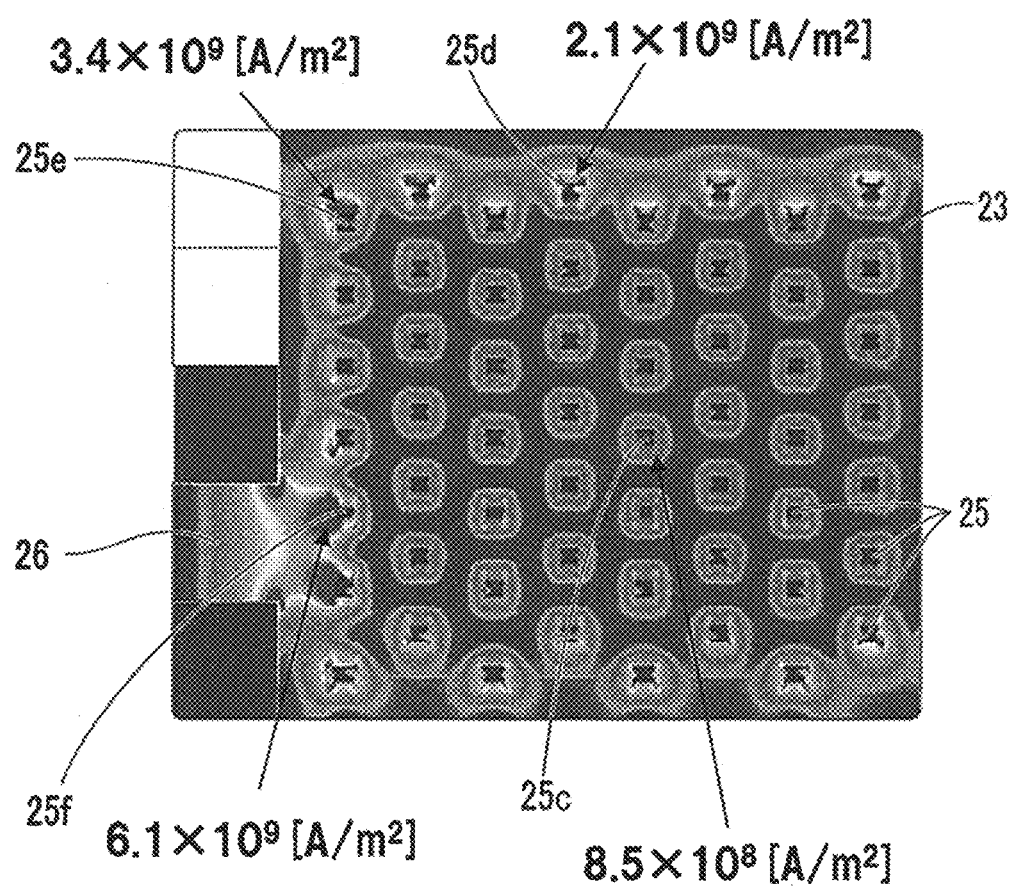
FIG. 6 is a view showing a simulation result of a distribution of a current density in an active area in a case where the test current is applied by a conventional contacting section.

FIG. 6 shows a result obtained by a simulation of a distribution of the current density of the current flowing into the active region 23, in a case where the application of the test current is performed using a conventional contacting section. Each spot constituted from a central portion with high concentration and a surrounding portion with low concentration, corresponds to each contact point 25 in which each projection 21 of the contacting section and the active region 23 contacts. In the conventional contacting section, the arrangement interval of the projections 21 on the contact surface thereof is constant throughout the contact surface. In correspondence thereto, the contact points 25 are arranged at constant interval.

In this case, as is shown in FIG. 6, the current density of the current flowing into the active region 23 is $8.5 \times 10^8 [\text{A/m}^2]$ at a vicinity of a contact point 25c at a center portion in the arrangement of the contact points 25, whereas the same is $2.1 \times 10^9 [\text{A/m}^2]$ at a vicinity of a contact point 25d positioned on one side between two corners of the arrangement. Further, the same is $3.4 \times 10^9 [\text{A/m}^2]$ at a vicinity of a contact point 25e positioned at a corner of the arrangement. Still further, the same is $6.1 \times 10^9 [\text{A/m}^2]$ at a vicinity of a contact point 25f close to the small pad 26.

That is, the current density in the vicinity of each contact point 25 is higher in the vicinity of the contact points 25 positioned at the outer peripheral portion than the inner portion of the contact region 24. Further, among the vicinity of the contact points 25 positioned at the outer peripheral portion, the current density is higher in the vicinity of the contact points 25 positioned at the corner portion than the contact points 25 positioned between the corner portions, and the same is further higher in the vicinity of the contact points 25 positioned in the vicinity of the small pad 26.

In such case, when the current supplied to the contacting section is increased above a certain extent, the current flowing the projections 21 corresponding to the contact points 25 with higher current density reaches a critical current value. The critical current value is a maximum current value that could be applied by one projection 21 without any trouble. Therefore, the magnitude of the test current capable of being applied is smaller compared to a case where the current with equivalent magnitude flows into the active region 23 from all projections 21.

As such, even when a number of necessary projections 21 and an arrangement interval thereof at the contacting section are determined, on the basis of the magnitude of the necessary test current and the critical current value, on assumption that the current flows equally in all projections 21, the current value flowing to the contact points 25d through 25f reaches the critical current value by flowing a current smaller than the test current, so that there are cases where the test current cannot be applied.

Figure 7:
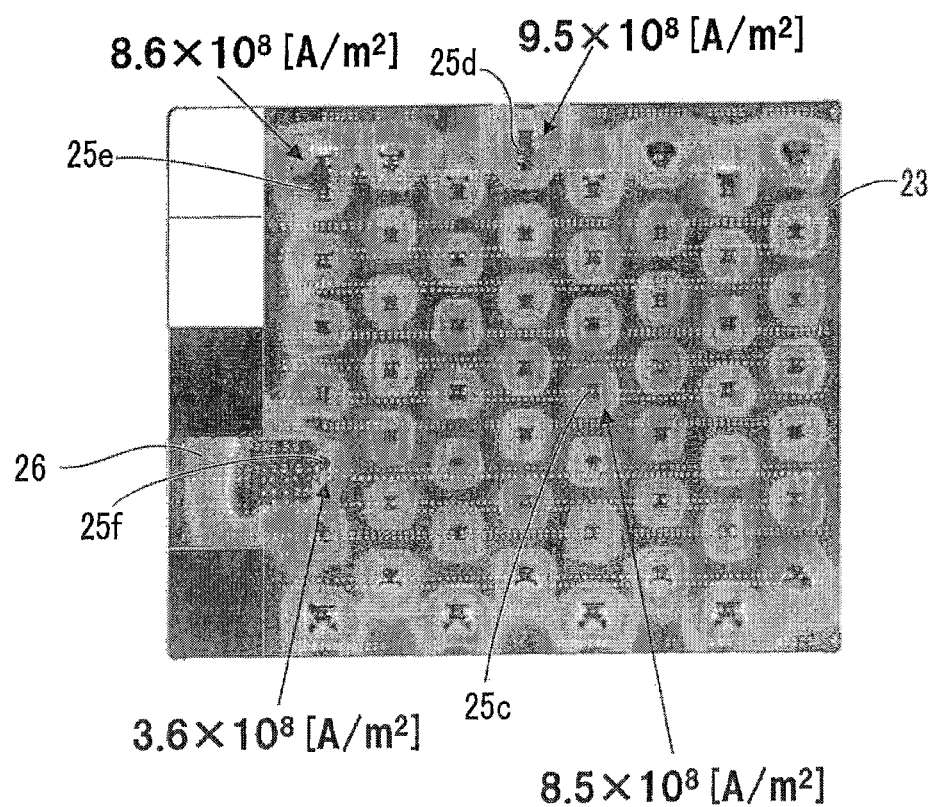
FIG. 7 is a view showing a simulation result under identical conditions with the simulation of FIG. 6 except that the projections are added to the contacting section.

On the other hand, FIG. 7 shows a result obtained by simulation with identical conditions as in FIG. 6, except that the projections 21 are added to the projection group of the contacting section. The addition of the projections 21 is performed similarly to FIG. 5, in which one additional contact point 25b exists in the vicinity of the contact point 25d, two additional contact points 25b exist in the vicinity of the contact point 25e, and nine additional contact points 25b exist in the vicinity of the contact point 25f close to the small pad 26.

According to the simulation result of FIG. 7, the current density in the vicinity of the contact point 25c at the center is $8.5\times10^8$ [A/m$^2$], which is no different from the simulation result of FIG. 6. However, the current density in the vicinity of the contact point 25d is $9.5\times10^8$ [A/m$^2$], the current density in the vicinity of the contact point 25e is $8.6\times10^8$ [A/m$^2$], and the current density in the vicinity of the contact point 25f is $3.6\times10^8$ [A/m$^2$].

That is, in a case where the projections 21 are added as is explained above, the current density at the vicinity of either one of the contact point 25d at the space between the corner portion and the corner portion at the outer peripheral portion of the contact region of the active region 23, the contact point 25e at the corner portion, or the contact point 25f close to the small pad 26, becomes approximately equivalent to the current density at the vicinity of the contact point 25c at the inner portion of the contact region 24.

As can be seen from the simulation results of FIG. 6 and FIG. 7, by making the arrangement interval of the projections 21 in the projection group of the contact surface 4 to be smaller for the outside projections 21 than the inside projections 21 of the projection group, as is shown in FIG. 5, it becomes possible to equalize the current density of the current flowing from each projection 21.

Further, by making the arrangement interval of the projections 21 in the projection group of the contact surface 4 to be smaller for the projections 21 at the outer peripheral portion than the projections 21 at the inner portion of the projection group, and also to be further smaller in the projections 21 at the corner portions among the projections 21 at the outer peripheral portion, it becomes possible to equalize the current density of the current flowing from each projection 21 with higher precision.

Still further, by recognizing the portion in which the current density becomes higher in the active region 23 in a case where the current is applied by a conventional contacting section having the projection group in which the arrangement interval of the projections 21 is uniform throughout, as is shown in FIG. 6, and making the arrangement interval of the projections 21 at the portion corresponding to the recognized portion to be smaller than the arrangement interval of the projections 21 at the portion corresponding to the portion in which the current density becomes lower, it becomes possible to more effectively equalize the magnitude of the current flowing into the active region 23 from each projection 21 throughout the whole projection group.

As is explained above, by equalizing the current in each projection 21, it becomes possible to prevent the magnitude of the supplied current to the contacting section 2 from being limited by some of the projections 21 reaching the critical current value. By doing so, as long as the current value is smaller than the critical current value of the projection 21, it becomes possible to supply the current obtained by multiplying the current value with the number of projections 21, to the contacting section 2 without any trouble. That is, it becomes possible to easily set the number of projections 21 for obtaining the test current of the necessary magnitude, and apply the test current of the intended magnitude without any trouble.

In the above-mentioned embodiment, the arrangement interval of the outside projections 21 among a plurality of the projections 21 is set to be smaller than the arrangement interval of the inside projections 21, so that the arrangement density of a plurality of the projections 21 on the contact surface 4 becomes larger in the outside than the inside. However, instead of the arrangement interval of a plurality of the projections 21, an arrangement area thereof may be changed.

Figure 8A:
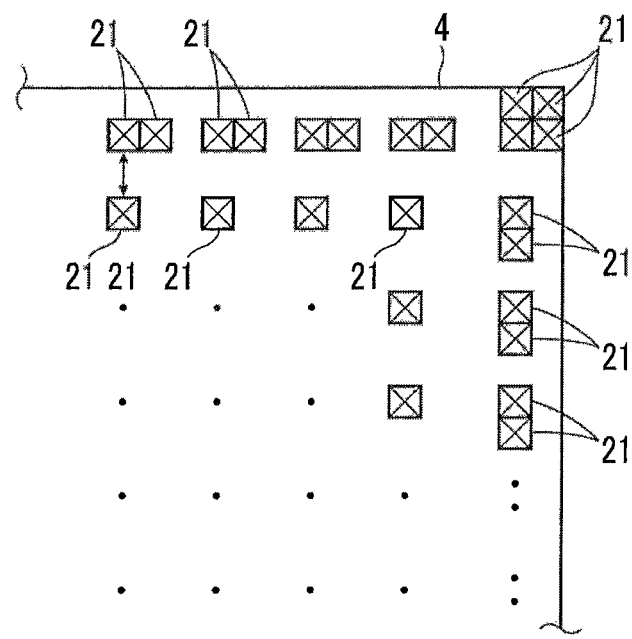
FIG. 8A and FIG. 8B are enlarged views of a corner portion of a contact surface in the current application device of FIG. 1.

Specifically, as is shown in FIG. 8A, by arranging the projections 21 at the outer peripheral portion among a plurality of the projections 21 on the contact surface 4 to be connected in a number of two or more, the arrangement area of the projections at the outer peripheral portion becomes larger than the arrangement area of the projections at the inside. Further, in addition thereto, by arranging the projections 21 at the corner portion among the projections 21 at the outer peripheral portion to be connected in two-by-two, the arrangement area of the projections at the corner portion becomes larger than the arrangement area of the projections at other outer peripheral portion.

Figure 8B:
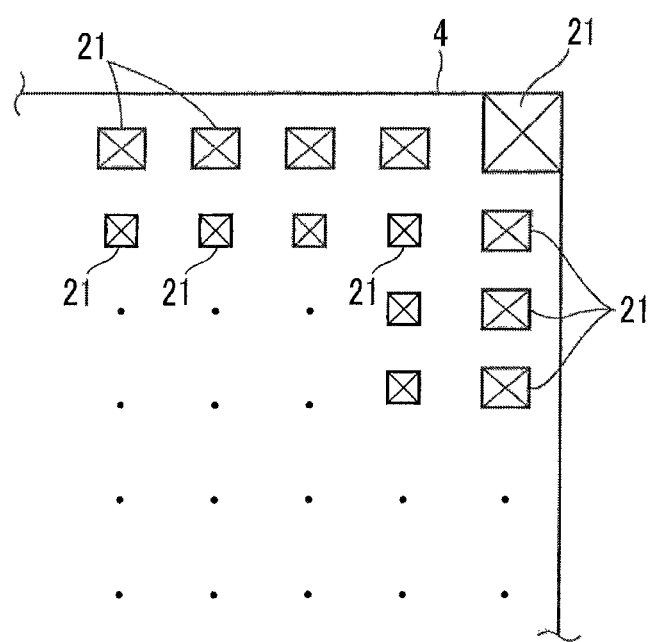

Alternatively, as is shown in FIG. 8B, by expanding and arranging the area of each projection 21 at the outer peripheral portion among a plurality of the projections 21 on the contact surface 4, the arrangement area of the projections at the outer peripheral portion becomes larger than the arrangement area of the inside projections. Further, in addition thereto, by further expanding and arranging the area of the projections 21 at the corner portion among the projections 21 at the outer peripheral portion, the arrangement area of the projections at the corner portion becomes larger than the arrangement area of the projections at other outer peripheral portion.

As is explained above, it becomes possible to make the arrangement density of a plurality of the projections on the contact surface 4 to be larger in the outside than the inside, by changing the arrangement area of a plurality of the projections 21. By doing so, the arrangement density of the outside projections 21 among a plurality of the projections 21 is larger than the arrangement density of the inside projections 21.

Lastly, an explanation will be given on a manufacturing method of a semiconductor element of the present invention.

As is shown in FIG. 9, a manufacturing method of the embodiment includes a step ST1 for forming the semiconductor element, a test step ST2 for applying the test current using the current application device 1 explained above, for determining pass-fail of the semiconductor element formed in the step ST1, a step ST3 for distinguishing whether or not the semiconductor applied with the test current in the test step ST2 is destroyed, a step ST4 for determining from the distinguishing result in the step ST3 to be a good product, and a step ST5 for determining to be a rejected product.

The test step ST2 corresponds to a current application step of the manufacturing method of the present invention, and the distinguishing step ST3 through ST5 correspond to a determination step of determining whether or not the semiconductor element satisfies a predetermined performance in the manufacturing method of the present invention.

In the above-mentioned embodiment, the current application test is performed in step ST2, taking the semiconductor element manufactured in the forming step ST1 using a known manufacturing method as an test target. This is, for example disclosed in Japanese Patent Application Laid-Open No. 2006-284490, a test method used in evaluation of RBSOA (Reverse Bias Safe Operating Area) capacity of an IGBT (Insulated Gate Bipolar Transistor). RBSOA represents a non-destructive operation range of a voltage between collector and emitter, and a collector current, accompanying turning off of IGBT, and a non-destructive performance with respect to the reverse bias becomes higher as the range becomes wider.

Therefore, in the test step ST2, the large current in applied to the semiconductor element as the test target using the current application device 1. For example, in a case where a designed value (a rated current) of RBSOA is 500 amperes, a current of 1000 amperes is applied. Thereafter, by verifying whether or not the semiconductor element applied with the test current satisfies a predetermined performance, it is distinguished whether or not the semiconductor element is destructed (step ST3). As a result thereof, the semiconductor element is determined to be a good product in a case where the semiconductor element is not destroyed (step ST4), and the semiconductor is determined to be a rejected product in a case where the semiconductor element is destroyed (step ST5).

According to the method of the present embodiment, the semiconductor elements that are appropriately tested using the current application device capable of applying the test current of the magnitude necessary for testing of the semiconductor elements without any trouble could be manufactured.

The illustrated embodiment of the present invention has been explained above. However, the present invention is not limited thereto. For example, in the above-explained embodiment, the one with the projections 21 having a square pyramid-like shape is used as the contacting section. However, a contacting section with wire probes and the like that are arranged as projections may be used.

What is claimed is:

1. A current application device, comprising:
a contacting section which includes a plurality of projections for contacting a contact region within an active region of a semiconductor element and for applying a test current thereto, in which the plurality of projections consist of inner side projections for contacting an inner side contact region of the active region and outer side projections for contacting an outer side contact region of the active region surrounding the inner side contact region, the outer side projections surrounding the inner side projections, and an arrangement density of the outer side projections is greater than an arrangement density of the inner side projections; and
a pressing section which presses the contacting section against the semiconductor element such that the plurality of the projections contact the contact region,
wherein an arrangement area of each of the outer side projections is larger than an arrangement area of each of the inner side projections.

2. The current application device according to claim 1, wherein an arrangement interval of the outer side projections is smaller than an arrangement interval of the inner side projections.

3. The current application device according to claim 1, wherein the plurality of the projections are arranged in a rectangular region, and
an arrangement interval of the outer side projections disposed at an outer peripheral portion of the region is smaller than an arrangement interval of the inner side projections disposed at an inner portion of the region, and also an arrangement interval of the outer side projections at a corner portion of the region is smaller than an arrangement interval of the outer side projections at portions other than the corner portion of the region.

4. The current application device according to claim 1, wherein an arrangement interval of the plurality of the projections is set to be smaller for each projection corresponding to a portion in which a current density of the active region becomes higher in a case where the test current is applied to the contact region from a contacting section in which the arrangement interval of each projection is uniform throughout the contacting section, than the arrangement interval of each projection corresponding to a portion in which the current density becomes lower in the case.

5. A current application device, comprising:
a contacting section which includes a plurality of projections for contacting a contact region within an active region of a semiconductor element and for applying a test current thereto, in which the plurality of projections consist of inner side projections for contacting an inner side contact region of the active region and outer side projections for contacting an outer side contact region of the active region surrounding the inner side contact region, the outer side projections surrounding the inner side projections, and an arrangement density of the outer side projections is greater than an arrangement density of the inner side projections; and
a pressing section which presses the contacting section against the semiconductor element such that the plurality of the projections contact the contact region,
wherein the plurality of the projections are arranged in a rectangular region, and
an arrangement area of each of the outer side projections disposed at an outer peripheral portion of the region is larger than an arrangement area of each of the inner side projections disposed at an inner portion of the region, and also the arrangement area of the outer side projections at a corner portion of the region is larger than the arrangement area of the outer side projections at portions other than the corner portion of the region.

6. The current application device according to claim 1, wherein an arrangement area of the plurality of the projections is set to be larger for each projection corresponding to a portion in which a current density of the active region becomes higher in a case where the test current is applied to the contact region from a contacting section in which the arrangement area of each projection is uniform throughout the contacting section, than the arrangement area of each projection corresponding to a portion in which the current density becomes lower in the case.

7. A manufacturing method of a semiconductor, comprising:
a forming step in which the semiconductor element is formed;
a current application step in which a test current is applied to the semiconductor element formed in the forming step, using a current application device configured to have a contacting section which includes a plurality of projections for contacting a contact region within an active region of the semiconductor element and for applying a test current thereto, in which the plurality of projections consist of inner side projections for contacting an inner side contact region of the active region and outer side projections for contacting an outer side contact region of the active region surrounding the inner side region, the outer side projections surrounding the inner side projections, the plurality of the projections are arranged such that an arrangement density of the outer side projections is greater than an arrangement density of the inner side projections, an arrangement area of each of the outer side projections is larger than an arrangement area of each of the inner side projections, and a pressing section which presses the contacting section against the semiconductor element such that the plurality of the projections contact the contact region; and a determination step of determining whether or not the semiconductor element applied with the test current in the current application step satisfies a predetermined performance, based on the test current.

* * * * *